(12) United States Patent
Van der Stam

(10) Patent No.: US 9,120,178 B2
(45) Date of Patent: Sep. 1, 2015

(54) METHOD OF RADIATIVELY GROOVING A SEMICONDUCTOR SUBSTRATE

(71) Applicant: Advanced Laser Separation International (ALSI) N.V., TL Beuningen (NL)

(72) Inventor: Karel Maykel Richard Van der Stam, Beuningen (NL)

(73) Assignee: ASM TECHNOLOGY SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/165,029

(22) Filed: Jan. 27, 2014

(65) Prior Publication Data

US 2014/0213043 A1    Jul. 31, 2014

Related U.S. Application Data

(63) Continuation of application No. 13/764,406, filed on Feb. 11, 2013.

(30) Foreign Application Priority Data

Jan. 28, 2013  (SG) ............................... 201300660-6
May 14, 2013  (EP) ..................................... 13167717

(51) Int. Cl.
*B23K 26/36* (2014.01)
*H01L 21/78* (2006.01)
*B23K 26/40* (2014.01)

(52) U.S. Cl.
CPC .......... *B23K 26/367* (2013.01); *B23K 26/4075* (2013.01); *H01L 21/78* (2013.01)

(58) Field of Classification Search
USPC ...................................... 438/635; 219/121.43
See application file for complete search history.

(56) References Cited

U.S. PATENT DOCUMENTS

| | | | |
|---|---|---|---|
| 5,922,224 A | 7/1999 | Broekroelofs | |
| 5,979,728 A | 11/1999 | Alfaro | |
| 6,383,940 B1* | 5/2002 | Yoshimura | 438/708 |
| 7,947,920 B2 | 5/2011 | Van Borkulo et al. | |
| 2008/0196229 A1 | 8/2008 | Van Beuningen | |
| 2010/0155379 A1* | 6/2010 | Shamoun | 219/121.68 |
| 2013/0334185 A1 | 12/2013 | Nomaru | |
| 2013/0334186 A1 | 12/2013 | Nomaru | |

* cited by examiner

*Primary Examiner* — David Vu
*Assistant Examiner* — Jonathan Han
(74) *Attorney, Agent, or Firm* — Pillsbury Winthrop Shaw Pittman, LLP

(57) ABSTRACT

A method of radiatively scribing a substantially planar semiconductor substrate using a laser scribing apparatus, uses a laser scribing head configured and arranged to produce a two-dimensional array of laser beam spots to effect the scribing. In an embodiment, the spots of the array extend substantially parallel to X and Y directions in the plane of the substrate. In an embodiment, spots at a periphery in one or both directions of the array have a lower intensity than laser beams in a central portion of the array.

17 Claims, 6 Drawing Sheets

METHOD OF RADIATIVELY GROOVING A SEMICONDUCTOR SUBSTRATE

RELATED APPLICATIONS

This application claims benefit of and priority to Singapore Application 201300660-6, filed Jan. 28, 2013, U.S. application Ser. No. 13/764,406, filed Feb. 11, 2013, and EP Application No. 13167717, filed May 14, 2013. Each of the foregoing applications is incorporated by reference herein in its entirety.

FIELD

The invention relates to a method of radiatively scribing a substantially planar semiconductor substrate using a laser scribing apparatus, whereby a non-penetrative groove is formed along a scribeline that extends between opposing rows of semiconductor devices on a target surface of the substrate, whereby a Cartesian coordinate system XYZ can be defined in which:

Said target surface lies in the XY plane;

Said groove extends parallel to the Y direction, with a width in the X direction;

in which method:

The substrate is clamped on a movable substrate holder so as to present said target surface to a laser scribing head;

Relative motion is effected between said substrate holder and said scribing head, so as to cause laser radiation from the head to translate along a course of said scribeline The invention also relates to a laser scribing apparatus in which such a method can be enacted.

BACKGROUND

For purposes of clarity and consistency, the following terms as used throughout this text and the appended claims should be interpreted as follows:

The phrase "substantially planar" should be construed as referring to a substrate in the (approximate) form of a sheet, plate, leaf, wafer, platen, etc. Such a substrate will generally be (substantially) flat in form, and present two opposed major surfaces separated by a relatively thin intervening "sidewall", though as will be appreciated, a substantially planar substrate may include some structure such as microcircuitry layers that have some degree of relief.

The phrase "semiconductor substrate" should be broadly interpreted as encompassing any substrate on which a semiconductor device or other integrated device is manufactured. Such substrates may, for example, comprise silicon or germanium wafers (of various diameters), and/or wafers of compound substances such as InAs, InSb, InP, GaSb, GaP or GaAs. The term also encompasses non-semiconductor materials (such as sapphire) on which one or more layers of semiconductor material have been deposited, e.g. as in the manufacture of LEDs. The semiconductor device or other integrated device concerned may, for example, be an integrated circuit, (passive) electronic component, opto-electronic component, biological chip, MEMS device, etc. Such devices will generally be manufactured in large numbers on a given substrate, and will typically be laid out in a matrix arrangement on at least one of said major surfaces.

The term "scribeline" (also sometimes referred to as a "scribelane") should be interpreted as referring to a (real or abstract) line extending along a major surface of a substrate, along which line the substrate is to be scribed. In the specific case of a semiconductor substrate, a scribeline will generally lie in a "street" (dicing street) that extends between neighboring/adjacent/opposed rows of integrated devices on the substrate, along which street the substrate is to be "diced" so as to allow (ultimate) separation of the devices in question. Such a procedure is often referred to as "singulation". It should be noted that scribelines on the target surface may be arranged in regular and/or non-regular (repetitive) configurations. For example, some wafers may comprise a regular matrix of identical integrated devices separated from one another by scribelines forming a regular orthogonal network. On the other hand, other wafers may comprise devices of different sizes, and/or located at non-regular pitches with respect to one another, implying a correspondingly irregular configuration of scribelines. The arrangement of such scribelines does not necessarily have to be orthogonal.

The term "groove" refers to a scribe (gouge, furrow, channel) that does not penetrate through the full thickness of the substrate in which it is created, i.e. creation of the groove does not directly cause severance of the substrate (in the Z direction). Substrate singulation involving such grooving is thus necessarily a multi-step procedure (as opposed to single-step singulation, in which the substrate is cut/severed through its full depth in a single operation). In multi-step singulation, one or more follow-up procedures are used to finish off the severing process, such as additional radiative scribing, mechanical sawing/cutting, etc. along the previously created groove.

The phrase "laser scribing head" refers to an optical assembly that can be used to produce and direct scribing laser radiation in a laser scribing apparatus/tool. Such a head will generally comprise at least one laser source and associated imaging/focusing optics. It may also comprise one or more ancillary components, such as beam splitters, diffractive optical elements or filters (for example), for performing specific processing operations on said laser radiation. Laser scribing apparatus is well known in the art of wafer singulation: see, for example, U.S. Pat. No. 5,922,224 and U.S. Pat. No. 7,947,920, which are incorporated herein by reference.

These points will be discussed in more detail below.

Grooving of semiconductor substrates using a laser scribing apparatus is a well-known and widely applied technique in the semiconductor manufacturing industry. It is applied, in particular, on semiconductor substrates comprising a relatively brittle and/or poorly adhered top layer, e.g. as in the case of a so-called "low-k" dielectric top layer (which has a relatively low dielectric constant (k) relative to silicon dioxide). Such problematic top layers (which are typically of the order of about 1-10 microns thick) are difficult to scribe using mechanical means, which tend to cause unacceptable cracking and/or de-lamination of the top layer in (external) regions bordering the intended scribe. However, such top layers can be much more satisfactorily ablated using a radiative scribing tool. Consequently, substrates carrying such a layer are conventionally first grooved using a laser scribing apparatus, before being singulated at a later juncture using a mechanical tool. An added advantage is that, in addition to neatly scribing the problematic top layer, radiative grooving can also remove certain surficial metal structures in the dicing street, such as so-called TEGs (Test Element Groups); this can help improve the useful lifetime of blades used for subsequent mechanical singulation. The depth of a radiative groove is typically of the order of about 15 µm (for instance). Because (saw) blades used for follow-up singulation tend to be relatively thick (e.g. about 50 µm wide), the groove itself will have to be correspondingly relatively wide, e.g. of the order of about 60 µm (for instance).

However, such use of radiative grooving as a prelude to mechanical singulation can cause certain problems. In particular, since the (ablative) radiative grooving process is thermal in nature, it will cause the generation of heat within the groove, but also in a peripheral zone running along the outside edges of the groove. This so-called Heat-Affected Zone (HAZ) adjacent to the groove is a region where temperatures are generally too low to cause ablation, but nevertheless high enough to cause other, unwanted thermal effects, such as burning, melting, discoloration or a change in other physical/chemical properties (such as dielectric constant, impedance, crystalline phase, etc.).

To avoid this HAZ issue, one can increase the width of the dicing street, so that devices located along the groove are moved further away from the HAZ. However, a wider dicing street entails a loss of available device area ("real estate") on the substrate, leading to an increase in cost per device. This is highly undesirable.

SUMMARY

Aspects of embodiments of the invention address one or more of the foregoing issues. More specifically, particular embodiments may provide an improved radiative grooving process, which is also more flexible. In particular, embodiments may provide a radiative grooving process that is controllable so as to have a more limited HAZ.

BRIEF DESCRIPTION OF THE DRAWINGS

The invention will now be elucidated in more detail on the basis of exemplary embodiments and the accompanying schematic drawings, in which.

In the Figures, where pertinent, corresponding parts are indicated using corresponding reference symbols.

DETAILED DESCRIPTION OF THE EMBODIMENTS

Figure 1:
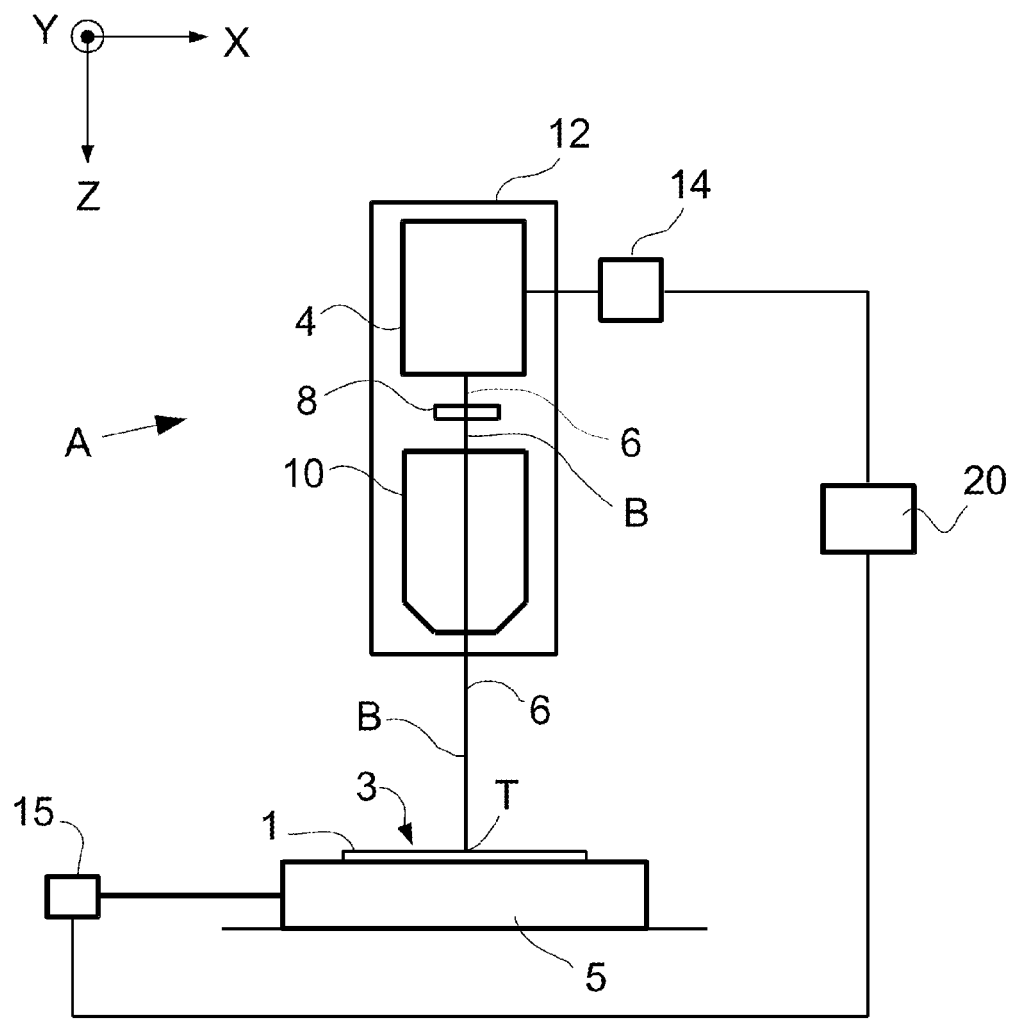
FIG. 1 renders an elevation (viewed along a Y axis) of part of a particular embodiment of a laser scribing apparatus suitable for performing a method according to the current invention.

These and other aspects are achieved in a method as specified in the opening paragraph, characterized in that, when viewed in said XY plane, the laser scribing head produces a two-dimensional array of laser beam spots.

Consequently, one cannot draw a single straight line through all the component beam spots of the array (within the substrate plane).

The invention achieves a number of important advantages, which will now be elucidated in more detail:

(i) First of all, grooving the substrate using a two-dimensional (2D) array of laser beams causes the grooving process to be enacted using multiple laser beams across the width of the groove and multiple laser beams along the length of the groove. Having multiple sub-beams in both of these directions allows a smoother distribution of radiative power than in the case of a single, large-diameter beam. More importantly, it also provides the possibility of adjusting the properties of individual beams, so that the whole array can be flexibly tailored to the requirements/peculiarities of a particular substrate/device/groove scenario.

(ii) In particular, the resultant intensity profile of such an array will be the sum of the intensity profiles of its component beams. Such a summed intensity profile can be tailored to have a sharper intensity fall-off along its edges (i.e. a more curtailed/abrupt intensity "skirt" or "tail"), with an associated substantial reduction in the width of the HAZ (see FIG. 6, for example).

(iii) In addition, the possibility of using different intensities for different beams in the array allows the possibility of creating deliberate temperature effects in the groove. For example, one can deliberately tailor the intensity of one or more beams so as to be too weak to cause (substantial) ablation but to be strong enough to cause (substantial) heating (and melting, for example), thus allowing non-ablative thermal processing to be performed.

(iv) Another advantage of the invention is related to throughput gain. Use of an array of laser beams can achieve in a single pass an end result that would otherwise have to be achieved as a sum effect of multiple, sequential passes. This not only greatly increases throughput, but also improves accuracy of the end result, since the need to correctly overlap/align subsequent passes in a multiple-pass procedure is obviated.

These aspects of the invention result in a highly flexible grooving process that produces a superior quality result in a variety of respects, as will be elucidated in more detail below.

In a particular embodiment of the invention, the beam spots in the 2D array extend substantially parallel to both the Y and the X directions (when viewed in the XY plane). Such an embodiment produces an "orthonormal" arrangement of spots within the dicing street (e.g. as opposed to a skewed, staggered or irregular arrangement—compare FIGS. 3 and 5, for example), and this in turn allows optimal exploitation of effects (i)-(iv) above. More particularly, it allows optimal and essentially separate adjustment of inventive effects in the length direction of the groove (along Y) and the width direction of the groove (along X).

An embodiment of the method according to the current invention is characterized in that, in at least a first part of the array, when viewed parallel to the X direction, not all laser beams have the same intensity. More particularly, one can conceive such a situation in which laser beams at the extremities of said array have a lower intensity than laser beams in a central portion of the array. Such an embodiment can produce a number of important effects, in that (for example):

If desired, it allows the creation of a groove that has a trough-shaped bottom in transverse cross-section (in the XZ plane), rather than a flat bottom. This trough-shaped bottom acts as a natural steering/auto justifying structure that constrains the tendency of a saw blade to drift transversely (in X), thus effectively mitigating potential saw wobble during follow-up mechanical singulation. This is a potentially important point, since a wobbling saw may cause chipping/cracking of the substrate at points where it impacts a groove edge. Such a trough-shaped groove bottom can take various different forms, which don't necessarily have to be symmetric; however, in a particular embodiment, when viewed in said first part, a sum intensity of the beams produces an intensity profile that is substantially symmetric about a Z axis centered on the array. Such an embodiment has the advantage of intrinsically centering the path of a saw blade in the width of the groove. Examples of such intensity profiles include a "V" shape and an inverted bell curve (Gaussian curve), for instance.

It allows less intense laser radiation to occur along the edges of the groove, thus allowing further reduction of the HAZ, and further mitigating the risk of thermal damage to the sides of devices facing the dicing street.

See (inter alia) items (i) and (ii) above. The embodiments set forth in this paragraph will be referred to hereafter (for ease of reference) as featuring an "X criterion" (since intensity is varied in the X direction).

Another embodiment of the method according to the current invention is characterized in that, in at least a second part of the array, when viewed parallel to the Y direction, not all laser beams have the same intensity. More particularly, one can conceive such a situation in which at least one laser beam at an extremity of said array has an intensity that is lower than the average intensity of the laser beams in said second part. Such an embodiment can produce a number of important effects, in that (for example):

By using a somewhat weaker "trailing" beam intensity at the rear of the array (considered in the "travel direction" in which the array is (relatively) translating along the substrate during grooving), one can achieve a "thermal post-conditioning" effect on the bottom of the groove, which significantly reduces roughness of the bottom surface. A smoother groove bottom leads, in turn, to reduced saw blade vibration/bumping during subsequent mechanical singulation.

By using a somewhat weaker "leading" beam intensity at the front of the array (again considered in the aforementioned travel direction), one can achieve a "thermal pre-conditioning" effect on the surface of the substrate. For example, a relatively low leading-beam intensity can perform relatively gentle scribing of brittle low-k material in advance of the more powerful "main beams" in the array; in this way, production/propagation of cracks into the devices adjacent to the dicing street is (further) mitigated.

It is a matter of choice whether, in a given situation, one or both of these thermal conditioning effects is/are chosen, i.e. whether one or both of the trailing or leading edges is/are provided with weaker beams. An advantage of having weaker beams at both the leading and the trailing edges of a symmetric array is that, when the array gets to the end of one scribeline and is stepped (typically) in the X direction so as to commence grooving a neighboring scribeline, the rotational orientation of the array (about the Z direction) need not necessarily be flipped—since what was a weaker (i.e. less intense) leading edge now becomes a weaker trailing edge, and vice versa.

See (inter alia) items (i) and (iii) above. The embodiments set forth in this paragraph will be referred to hereafter (for ease of reference) as featuring a "Y criterion" (since intensity is varied in the Y direction).

It should be noted that the abovementioned X criterion/Y criterion (if/when applied) may—according to choice and when viewed in the relevant direction (X/Y, respectively)—apply to the whole array or just to the indicated relevant part of the array (first/second part, respectively). For example, consider an array of laser beam spots in the form of a rectangular n×m array with n "rows" (each extending in X, and spaced in Y) and m "columns" (each extending in Y, and spaced in X), where n≥3 and m≥2. Then:

Said X criterion may be chosen to apply to all n rows, or just to a subset of n, and possibly to only a single row. If it is chosen to apply to more than one row, then it need not be applied identically to each such row; for example, in row n1, central beams might be 20% more intense than peripheral (extremal) beams whereas, in another row n2, central beams might be 30% more intense than peripheral beams. It should also be noted that "left" and "right" peripheral beams do not necessarily have to have the same intensity.

Similarly, said Y criterion may be chosen to apply to all m columns, or just to a subset of m, and possibly to only a single column. Once again, if it is chosen to apply to more than one column, then it need not be applied identically to each such column; for example, in column m1, a trailing beam might be 20% less intense than average whereas, in another column m2, a trailing beam might be 30% less intense than average, and a leading beam might be 40% less intense than average. Furthermore, it should be noted that the "main beams" other than the trailing and/or leading beams do not all have to have the same intensity. For example, in a column containing n=5 beams (for instance), one might choose an intensity profile as follows:

$n_1$: Intensity=30% I (leading beam);
n2: Intensity=100% I;
n3: Intensity=80% I;
n4: Intensity=60% I;
n5: Intensity=40% I (trailing beam), where "I" denotes a given (arbitrary) intensity value. The skilled artisan will understand that there are many other possibilities, and that he may choose an intensity profile that suits his requirements in a given grooving scenario.

As regards the geometry of the two-dimensional array of laser beam spots in the current invention (when considered parallel to the XY plane), it should also be noted that this array can take many different forms. In particular, it should be noted that:

The beam spots in the array may be arranged in a grid pattern that can be orthogonal or non-orthogonal with respect to the Y direction;

One region of the array may be arranged on one grid, and another region of the array may be arranged on another grid, and these grids may have various attitudes with respect to one another, e.g. they may be staggered, sheared, canted, etc.

As regards the actual production of the two-dimensional beam array used in the current invention, the skilled artisan will appreciate that such an array can be realized in different manners. For example, one could envisage a scenario whereby each individual beam in the array is produced by its own laser; however, since the lasers used in laser scribing apparatus tend to be rather expensive, such a scenario tends to be somewhat prohibitive in terms of cost. An alternative approach uses a single laser, but sub-divides (splits) its output into multiple sub-beams. Such sub-division could be achieved using a nest of individual polarizing beam splitters, for example. However, in a particular embodiment of the current invention, a so-called Diffractive Optical Element (DOE) is used for this purpose. Such a DOE can be tailor-made to individual specifications, so as to produce a particular desired beam array configuration (e.g. a 3×3 square array, or an isosceles trapezoidal array with a leading row of 5 beams and a trailing row of 3 beams, among many other possibilities).

In a refinement of the embodiment set forth in the previous paragraph, said beam array is produced using a series arrangement of at least two Diffractive Optical Elements, one of which produces beam sub-division in the X direction and the other of which produces beam sub-division in the Y-direction. Use of the expression "series arrangement" in this situation indicates that light traverses first one DOE, then the other. Such an arrangement is advantageous in that it offers more flexibility as regards separate adjustment of parameters of the inventive beam array in the X and Y directions.

So as to furnish increased flexibility as regards the beam array parameters referred to above, one may, if desired, provide a variety of different DOE(s) in an exchanger mechanism, which can be used to switch different DOEs in and out of the optical path of the laser light. Such a mechanism might, for example, be based on a carrousel principle, or use a sliding rack such as that used to store/load photographic slides in a slide projector. In the case of a series arrangement of two DOEs, two exchangers could be provided in series arrangement.

As regards embodiments in which mutually different beam intensities are exploited by the current invention (e.g. see the abovementioned X and Y criteria), it should be noted that such intensity differences can be taken into account when providing specifications for the manufacture of a particular DOE (which can be made-to-order by various manufacturers); different DOEs can then be used if one wants to change the intensity profile/distribution in the inventive laser beam array. However, according to an embodiment of the present invention, there is also a more flexible way to relatively adjust the intensities of the various component beams in said array. To this end, before impinging upon the substrate, the array is caused to traverse a spatial light modulator device having a programmable surface comprising a matrix of "pixels" (or programmable "tiles"), individual pixels being adjustable so as to variably attenuate individual beams in the array. Such a programmable surface can, for example, be realized using a liquid crystal screen. An embodiment of this type allows great flexibility in "playing" with different relative intensities of component beams in the array, without having to have a whole range of DOEs for this purpose.

It should be noted that the mutual spacing of beams/spots in the array according to the present invention is a matter of choice. With reference to aspect (ii) above, the beam spacing will affect inter alia the manner in which the intensity profiles of adjacent individual beams sum up, thereby also affecting the shape/size of the resultant/aggregate intensity profile of the combined beams. With particular regard to the Y direction, it should be remembered that a static reference point in a dicing street will "see" successive beams in the array pass it by as the array translates relative to the substrate surface during radiative scribing. So, in addition to the abovementioned point regarding profile summing, there is the additional consideration that the mutual spacing of beams in the Y direction will (co-)determine the state/temperature of a given point in a dicing street upon "arrival" of a beam of ordinal n+1 subsequent to previous traversal by a beam of ordinal n. In a particular embodiment, substrate material at such a point has preferably re-solidified (after previous melting by beam n) upon arrival of beam n+1, i.e. beam n+1 does not encounter molten substrate material. For a beam diameter (spot size) of about 10 µm at the substrate surface, and an array translation speed of about 0.4 m/s, good results can be achieved using a Y-separation of about 50 µm (center-to-center) between successive beam spots (in the travel direction). However, this is just an example, and the skilled artisan will be able to tailor employed beam spacings (in the X and Y directions) to the needs and particulars of a given situation.

It should be explicitly noted that not all laser beams in the inventive beam array need have the same focal depth relative to the XY plane (i.e. Z position of the focal point below the XY plane). In so-called "stealth dicing", a scribing laser beam is focused into the bulk of a substrate rather than onto its surface. If desired, a somewhat related approach may be used in the current invention. For example:

When considered in the abovementioned travel direction along a scribeline, one may elect to have successive rows of beams focused to successively greater depths (with trailing rows focused to deeper depths than leading rows).

One may elect to have beams located near the edges of a groove to be focused to a more shallow focal depth than beams located toward the center of the groove.

In a particular embodiment of the current invention, multiple grooves are concurrently scribed along different scribelanes (on a given substrate), each groove being scribed using a 2D-beam array according to the current invention (i.e. a two-dimensional array of laser beam spots, as viewed in the XY plane). In such a set-up, each 2D-beam array is (adjustably) separated from its neighbor by a distance equal to the distance between two adjacent dicing streets, or an integer multiple of this distance. A "multi-tasking" arrangement such as this can be used to achieve higher throughput, since several (two or more) dicing streets are grooved in parallel. Such an embodiment can be realized in different ways—for example:

The employed scribing head can produce a plurality of individual 2D beam arrays;

A plurality of scribing heads can be used, each scribing head producing a single 2D beam array.

In a specific example:

A pair of 2D beam arrays is used, (adjustably) separated from each other in the X direction by a distance equal to the (local) X separation (pitch, Pd) of dicing streets;

After a pair of grooves has been scribed (on a given substrate) in the +Y direction, relative motion in the X direction is effected between the substrate and scribing head(s), so as to cause a shift/displacement of magnitude $\Delta X=2$ Pd. Thereafter, scribing is performed in the −Y direction.

And so forth.

In an exemplary method according to the present invention—which is not intended to be in any way limiting upon the scope of the invention but is merely presented here for the purpose of giving concrete, practical examples—the following aspects apply:

An input laser beam is selected to have a wavelength in the range 200-3000 nm and an output power in the range 1 mW-100 W. The chosen laser will depend largely on the material of the substrate being scribed. Wavelengths in this range can be produced by a variety of lasers. For example, a solid-state Nd:YAG laser produces a wavelength of 1064 nm, with harmonics at 532 nm and 355 nm. Alternatively, one can use, for example a doped fiber laser with a wavelength of 1062 nm. Said 355 nm wavelength is particularly attractive because:

It tends to be strongly absorbed by semiconductor materials;

It can generally be focused relatively easily to a relatively small spot size.

However, this is purely a matter of choice, and other wavelengths can alternatively be employed.

Use is made of a laser source capable of delivering a pulsed laser beam, with a pulse duration in the range of about 1 microsecond–100 femtoseconds.

Using a DOE, the input laser is divided so as to form a two-dimensional array of beams (sub-beams), e.g. in the form of a rectangle comprising 3 or 4 beams in the X-direction and 2-4 beams in the Y direction.

Embodiment 1

FIG. 1 renders an elevational view of part of a particular embodiment of a laser scribing apparatus A suitable for conducting the method according to the current invention, usable to radiatively scribe a substantially planar semiconductor substrate 1 along at least one scribeline 2 (not depicted; see FIG. 2) on a target surface 3 of the substrate 1. On the other hand, FIG. 2 renders a plan view of an aspect of the lower portion of FIG. 1. Note the Cartesian coordinate system XYZ shown in the figures.

Figure 2:
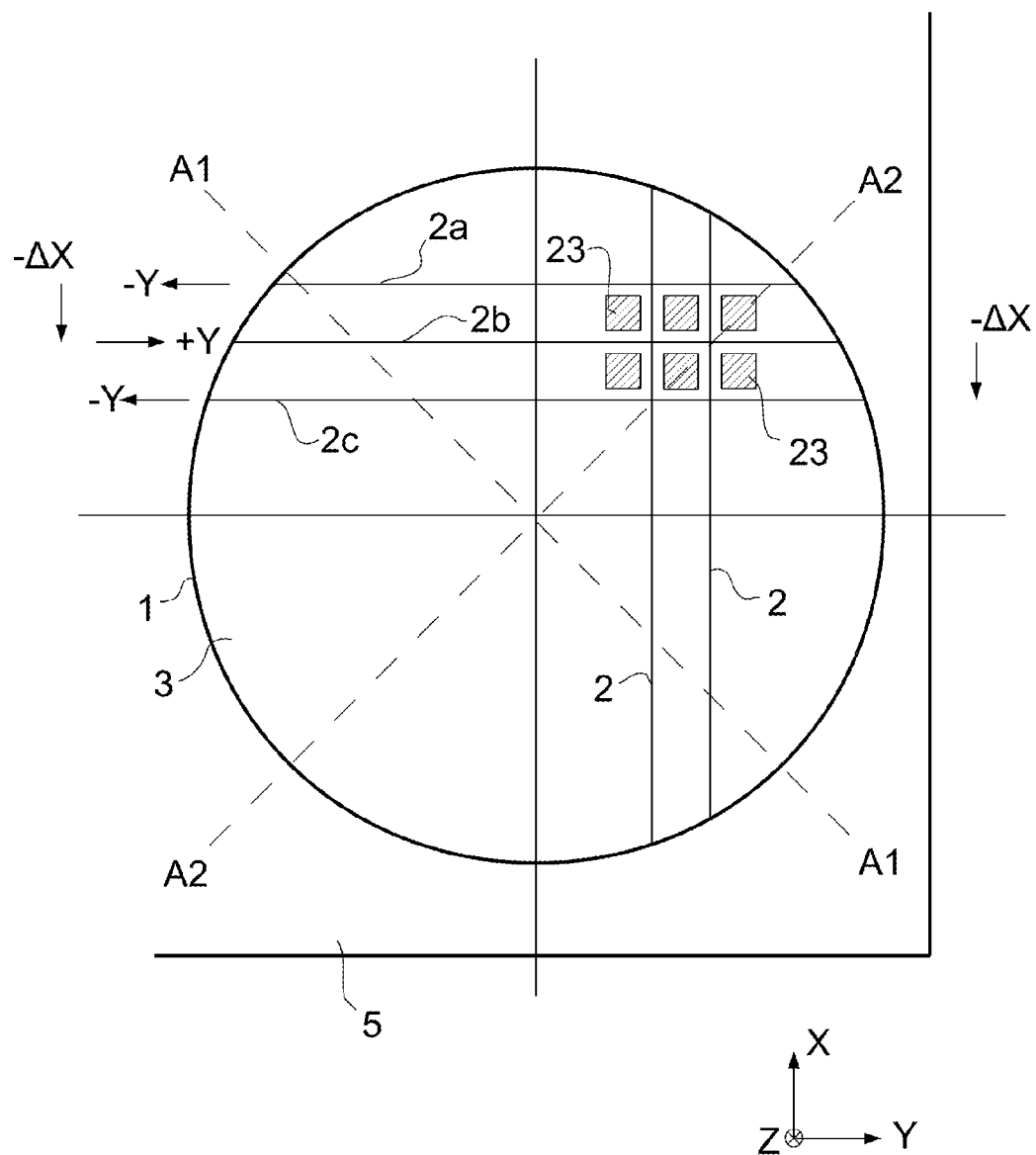
FIG. 2 renders a plan view (along a Z axis) of part of the subject of FIG. 1, in particular a lower portion of FIG. 1.

Specifically, FIGS. 1 and 2 collectively show the following:

A laser source 4, which outputs (pulsed) laser radiation along an optical axis 6. The laser source 4 is connected to a controller 14 that can be used inter alia to control parameters such as the pulse duration and power/fluence of said laser radiation.

Figure 3:
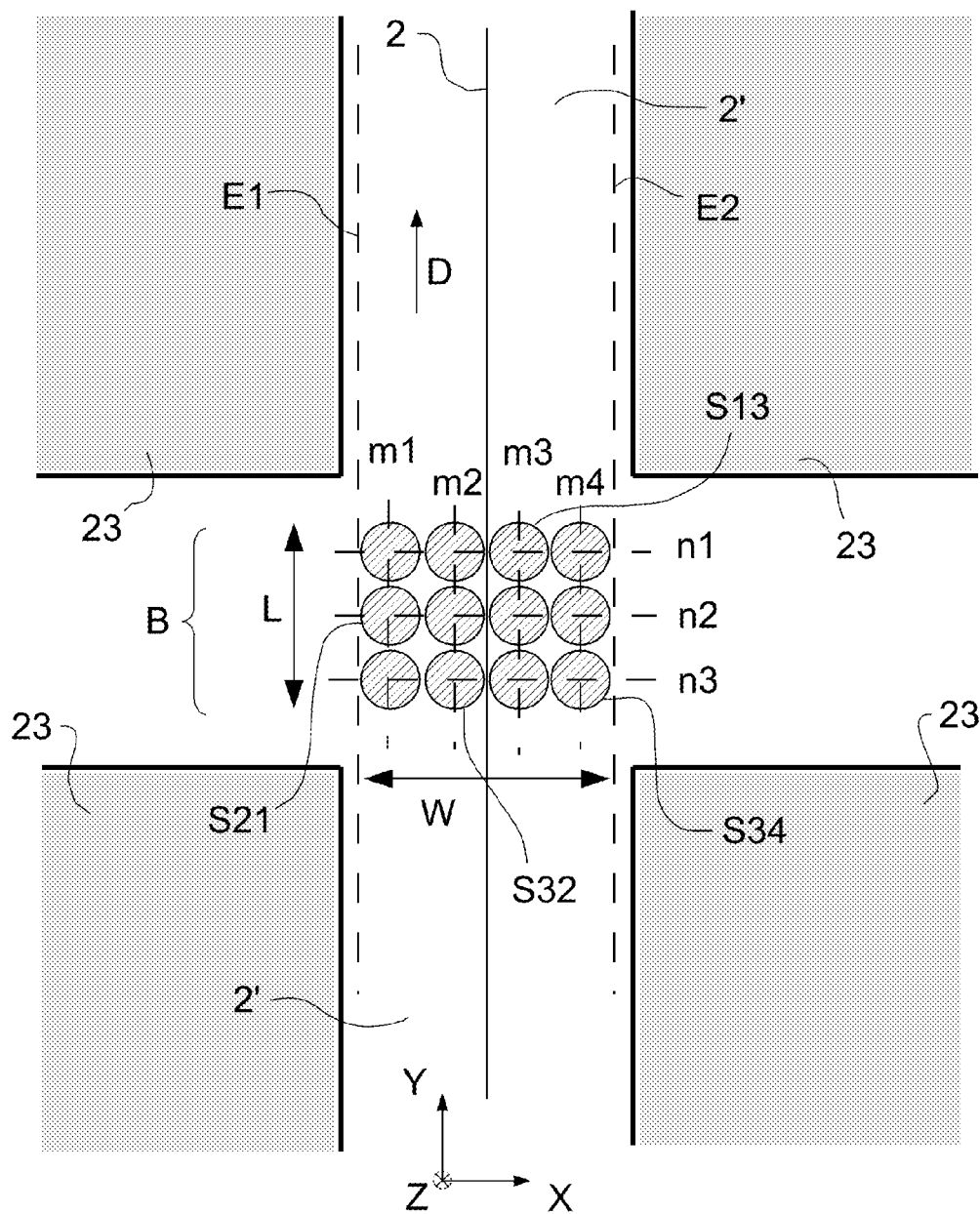
FIG. 3 depicts a magnified plan view (along a Z axis) of a region of interest of the substrate shown in FIGS. 1 and 2.

A beam sub-divider 8, which converts said laser radiation into a two-dimensional array B of laser beams (see FIG. 3, for example). This sub-divider 8 may, for example, comprise one or more DOEs.

A movable substrate holder (table, chuck) 5 onto which the substrate 1 is mounted to as to present the target surface 3 to the laser array B. Such mounting conventionally occurs via peripheral clamping, for example.

A projection (i.e. imaging) system 10, for projecting the laser array B onto the substrate 1. The area of impingement of the array B upon the substrate 1 is here denoted by T. The projection system 10 may be used to focus (components of) the array B onto or into the substrate 1, as desired, and may also perform aberration/distortion correction, for example. The combined components 4, 8, 10 are comprised in what will here be referred to as a laser scribing head 12.

A stage assembly 15, which can position the substrate holder 5 relative to the optical axis 6, in the XY plane.

FIG. 2 shows the substrate 1 viewed from above, as it rests upon the substrate holder 5. Upon the target surface 3, various scribelines 2 are illustrated. These scribelines 2 run in an X/Y grid pattern between integrated devices 23 that are distributed in a matrix arrangement on the surface 3; there will generally be very many such devices 23 on a typical semiconductor substrate 1, but only a few have been illustrated here, so as not to clutter the drawing. The Figure depicts a "longitudinal scan and lateral step" approach to scribing the substrate 1 along multiple, successive scribelines 2 in a particular direction (in this case ±Y). For example:

The substrate 1 is scribed along scribeline 2a by scanning the laser array B in the −Y direction; in practice, this relative motion can actually be achieved by using the stage assembly 15 (see FIG. 1) to scan the substrate holder 5 in the +Y direction.

After completing the scribing run along scribeline 2a, the stage assembly 15 will be used to step the substrate holder 5 in the +X direction by an amount ΔX; as a result, the laser array B will effectively be stepped with respect to the target surface 3 by an amount −ΔX.

The substrate 1 is now scribed along scribeline 2b by scanning the laser array B in the +Y direction; in practice, this relative motion can be achieved by using the stage assembly 15 to scan the substrate holder 5 in the −Y direction.

And so forth.

It should be noted that there are various ways of embodying the stage assembly 15, and the skilled artisan will be able to implement many alternatives in this regard. One particular embodiment, which is schematically depicted in FIG. 2, uses two separate linear motors (not depicted) to independently drive the substrate holder 5 along axes A1 and A2, which subtend angles of 45° with the X,Y axes; motion in X or Y then involves concurrent driving along the A1 and A2 axes. Typically, the substrate holder 5 will be caused to float smoothly over a reference surface (such as a polished stone surface) parallel to the XY plane, e.g. with the aid of an air bearing or magnetic bearing (not depicted). The exact position of the substrate holder 5 can be monitored and controlled with the aid of positioning instruments such as interferometers or linear encoders, for example (not depicted). Moreover, focus control/level sensing (not depicted) will also typically be employed, to ensure that the target surface 3 of the substrate 1 is maintained at a desired level with respect to the projection system 10. All such conventional positioning and control aspects will be very familiar to the skilled artisan, and do not require any further elucidation here.

The skilled artisan will also appreciate that, conventionally, a substrate 1 that is to undergo scribing will first be mounted on a foil that is spanned within a circumferential frame, and that it is therefore the composite structure of substrate, foil and circumferential frame that will have to be mounted on the substrate holder 5. Equally, the skilled artisan will appreciate that, after singulating an entire substrate 1, the substrate can be separated along the various scribelines by laterally stretching said foil, for example. These are such intrinsic aspects of the field of semiconductor substrate scribing that they do not require further elucidation here; for more information, reference is made to the following publications (for example):

U.S. 2008/0196229 A1 and U.S. Pat. No. 5,979,728.
http://en.wikipedia.org/wiki/Dicing_tape
http://www.lintec-usa.com/di_t.cfm#anc01.

As here depicted, (master) controller 20 is connected to the laser controller 14. The controller 20 is also connected to the stage assembly 15, so that relative positioning of the substrate 1 and laser array B can be adjusted.

Turning now to FIG. 3, this shows a magnified plan view of a region of interest of the substrate 1. Depicted is a scribeline 2 extending in the Y direction between four devices 23. The scribeline 2 is located along the center of a dicing street 2'. Here, the two-dimensional laser beam array B is shown to comprise twelve component beam spots (denoted by circles), which are arranged in this particular case in a rectangular configuration with n rows (n=3 in this instance) and m columns (m=4 in this instance), each of the rows n1, n2, n3 extending parallel to the X direction (parallel to the width of the dicing street 2') and each of the columns m1, m2, m3, m4 extending parallel to the Y direction (parallel to the length of the dicing street 2'). Individual beams (spots) in the array B are denoted using the nomenclature $S_{ij}$, where i indicates the row number and j denotes the column number; as examples of this nomenclature, beams S13, S21, S32 and S34 are explicitly labeled. The array B has a width W (parallel to X) and a length L (parallel to Y). In this particular instance, W lies in the range 40-70 μm (e.g. 45 μm), L lies in the range 100-1000 μm (e.g. 150 μm), each beam $S_{ij}$ has a diameter (spot size) in the range 5-15 μm (e.g. 12 μm) and the width of the dicing street 2' (parallel to X) is W+(5-10 μm) The array B is shown as translating in a direction D along the course of the scribeline 2. Consequently, in this case, row n1 may be regarded as the leading edge ("front" extremity) of the array B, and row n3 is its trailing edge ("back" extremity). Similarly, columns m1 and m4 define "left" and "right" extremities/edges of the array B.

As the inventive beam array B translates along the direction D in the dicing street 2', its component beams $S_{ij}$ will ablate material out of the substrate 1, thus creating a groove G (which does not extend through the full thickness of the substrate 1). This groove G is not depicted in FIG. 3 (so as not to clutter the drawing), but it is clearly visible in FIG. 4 (which represents a transverse cross-sectional view of part of FIG. 3);

however, longitudinal edges E1 (left) and E2 (right) of the groove G are schematically rendered in FIG. 3. In this particular instance, both the X criterion and the Y criterion referred to above have been applied and, as a result of appropriate choice of beam intensities in the respective X and Y directions:

The groove G has a trough-shaped bottom G';
The bottom G' of the groove G has a relatively smooth surface.
The maximum depth of the groove G in the current situation lies in the range 10-20 nm (e.g. 20 µm) and the RMS (Root Mean Square) roughness of its bottom G' is ca. 1-2 µm. Note that the dot-dash lines labeled m1, m2, m3, m4 in FIG. 4 correspond to the X locations of the beam columns m1, m2, m3, m4 of FIG. 3.

As an example of a choice of beam intensities that can be selected in the current situation, reference is made to Table 1 below, in which the symbol "I" represents a given intensity (e.g. 20 µJ per pulse for a pulse length of 200 ns):

TABLE 1

| row | column | | | |
|---|---|---|---|---|
| | m1 | m2 | m3 | m4 |
| n1 | 0.7I | I | I | 0.7I |
| n2 | 0.7I | I | I | 0.7I |
| n3 | 0.4I | 0.7I | 0.7I | 0.4I |

Note in the current situation that:

In any given row, beams at the left and right extremities have lower intensities than central beams.

In any given column, the trailing beam has a lower intensity than the (two) other beams.

It should also be noted that:

Each of the rows n1, n2, n3 (or an adjacent pair of rows, for example, or the whole set of three rows) can be regarded as corresponding to the abovementioned "first part" of the array B viewed parallel to the X direction;

Each of the columns m1, m2, m3, m4 (or an adjacent pair or triplet of columns, for example, or the whole set of four columns) can be regarded as corresponding to the abovementioned "second part" of the array B viewed parallel to the Y direction.

In particular, it should be noted that the abovementioned X criterion/Y criterion do not have to apply to all pertinent parts of the array B each only needs to apply to at least one pertinent part. For example, in Table 1 above, one could replace the last row n3 by an alternative row n3' (Table 2), and still remain within the ambit of the aforementioned X and Y criteria for the array as a whole:

TABLE 2

| n3' | 0.7I | 0.7I | 0.7I | 0.7I |
|---|---|---|---|---|

In such an alternative:

The X criterion now applies to rows n1 and n2, but not to row n3';

The Y criterion now applies to columns m2 and m3, but not to columns m1 and m4.

It should be explicitly noted that, in an alternative embodiment, one or both of the following may instead apply:

In each row, beams considered in the X direction have (substantially) equal intensities; in such a case, the X criterion does not hold.

In each column, beams considered in the Y direction have (substantially) equal intensities; in such a case, the Y criterion does not hold.

Figure 4:
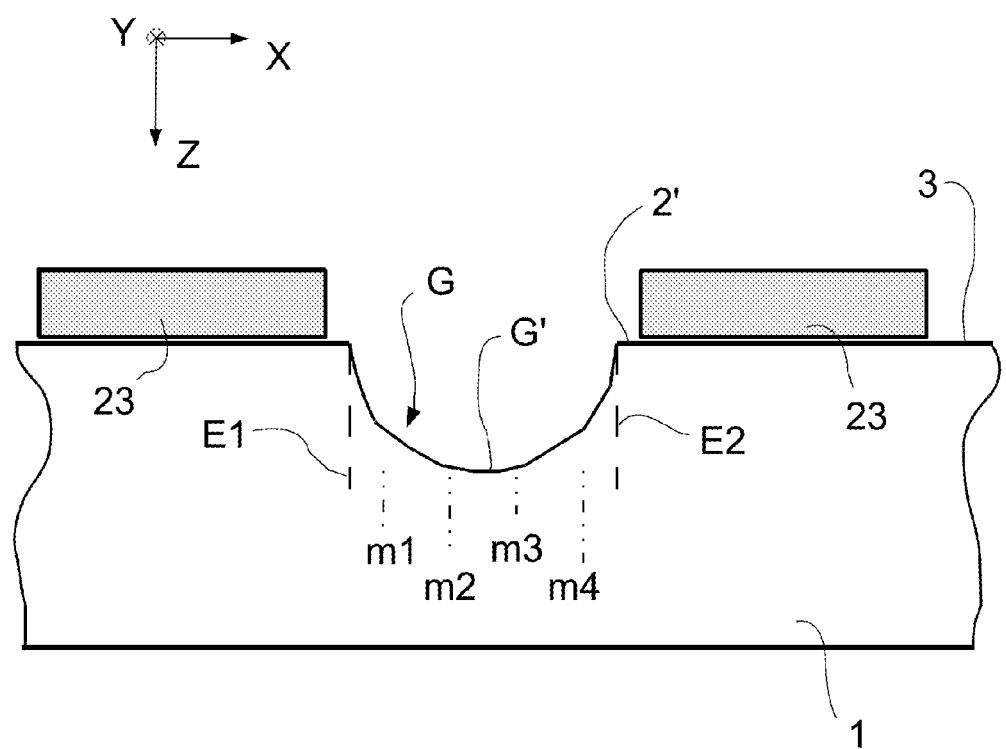
FIG. 4 renders a transverse cross-sectional view of part of FIG. 3.

It should also be noted that, although the groove G depicted in FIG. 4 has a trough-shaped bottom G', this does not have to be the case; instead, appropriate choice of beam intensities in the array B could, for example, produce a groove with a substantially flat bottom.

Embodiment 2

Figure 5:
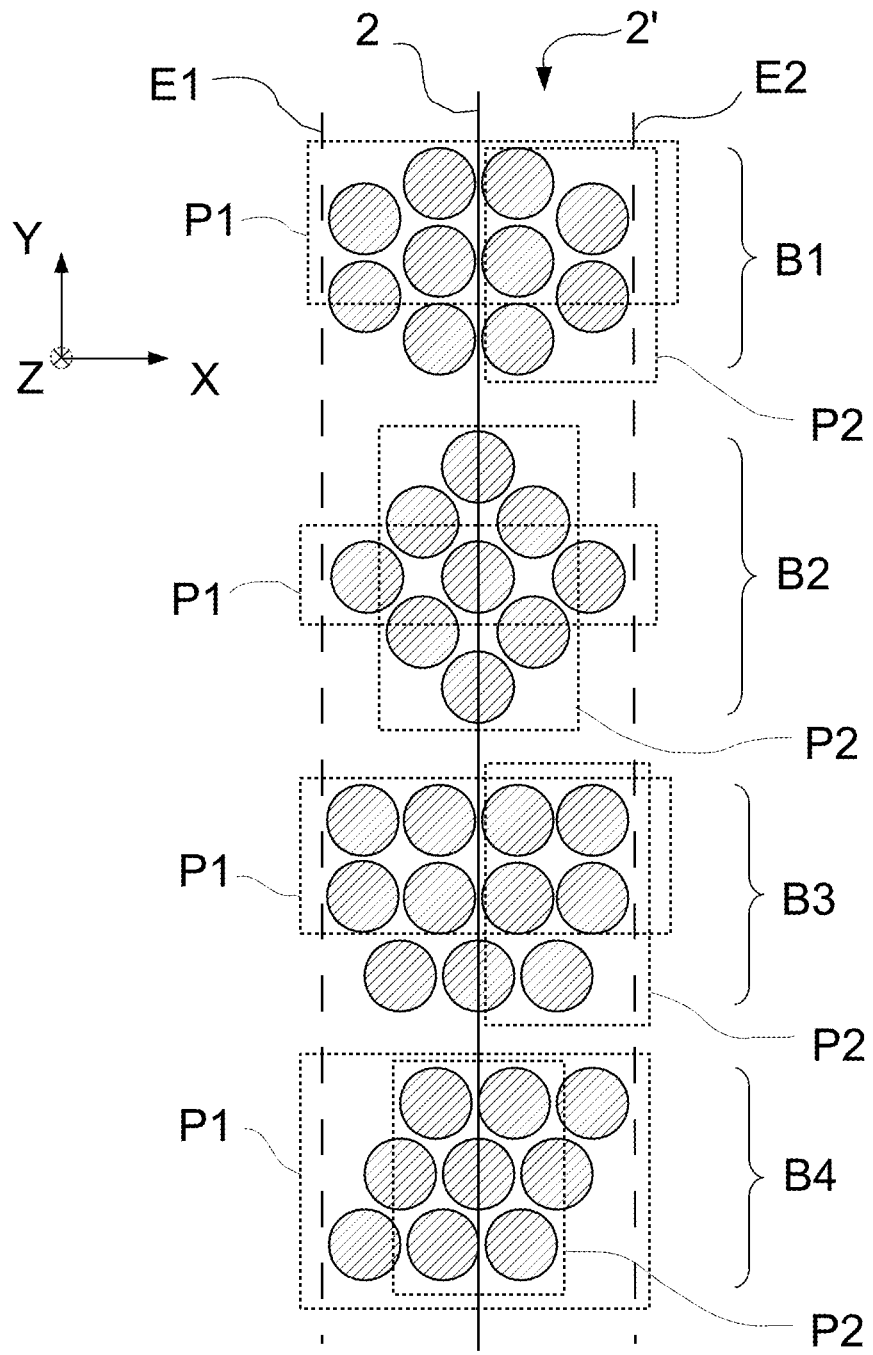
FIG. 5 renders a plan view (along a Z axis) of various possible geometries of a laser beam (spot) array in accordance with the current invention, as alternatives to the situation depicted in FIG. 3.

FIG. 5 renders a plan view (along a Z axis) of various possible geometries of a laser beam (spot) array in accordance with the current invention, as alternatives to the situation depicted in FIG. 3. As in FIG. 3, FIG. 5 depicts a scribeline 2, dicing street 2' and longitudinal edges E1, E2 of a groove G (not shown). Also depicted are four different laser beam arrays B1, B2, B3, B4 (from top to bottom of the Figure). In each of these beam arrays B1, B2, B3, B4, the Figure depicts possible candidates for the "first part" P1 and "second part" P2 referred to above in the context of the X criterion and Y criterion, respectively, whereby it should be explicitly noted that other candidates for these parts can also be conceived. The illustration of such potential parts in FIG. 5 does not mean that the X criterion and Y criterion actually have to be applied.

Embodiment 3

Figure 6:
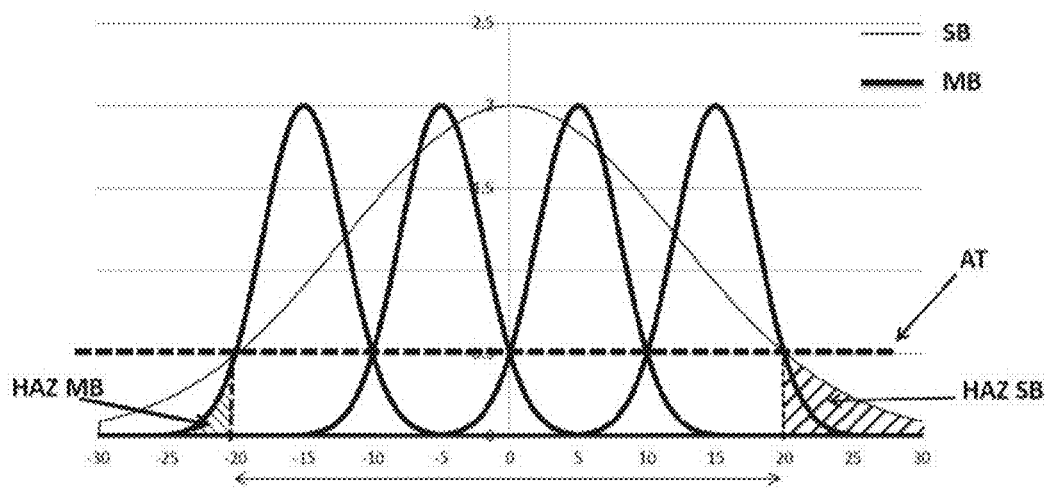
FIG. 6 illustrates the effect of summing intensity profiles of several component laser beams in comparison to an intensity profile of a single laser beam, and demonstrates how a narrower Heat-Affected Zone (HAZ) can be achieved using the current invention.

FIG. 6 illustrates the effect of summing intensity profiles of several component laser beams in comparison to an intensity profile of a single laser beam, and demonstrates how a narrower HAZ can be achieved using the current invention.

The Figure is a graph of beam intensity (in arbitrary units) as a function of X position (in µm) with respect to a central longitudinal axis of a dicing street. The dashed line marked "AT" indicates the so-called ablation threshold, i.e. the minimal value of the beam intensity needed to produce ablation of substrate material; below this line, substrate material will be heated/melted, but not (systematically) ablated.

The Figure additionally illustrates two different intensity profiles, which can be elucidated as follows:

(a) A thin line represents the (Gaussian) intensity distribution produced by a single beam (SB) centered on said longitudinal axis. The "skirt" or "tail" of this Gaussian bell located below the line AT defines the Heat-Affected Zone (HAZ) in this instance, which is highlighted at the right side of the figure using shading.

(b) A thick line is used to represent the (Gaussian) intensity distributions of a multi-beam (MB) array in accordance with the current invention; in this particular case, four beams of identical intensity straddle said longitudinal axis symmetrically. These four individual Gaussian bells will sum to produce a resultant intensity distribution (not shown). Because each component Gaussian bell has a sharper fall-off than the curve in (a), the edges of the array will cross the line AT more steeply. As a result, the HAZ in this instance will be much smaller: see the shaded region at the left of the Figure.

Note that the width of the groove produced in situations (a), (b) will be defined by the points where the respective intensity curves intersect the line AT. In the current case, a groove width of ca. 40 µm is observed (denoted by the double-ended arrow below the horizontal axis).

What is claimed is:

1. A method of radiatively scribing a substantially planar semiconductor substrate using a laser scribing apparatus, whereby a non-penetrative groove is formed along a scribeline that extends between opposing rows of semiconductor devices on a target surface of the substrate, whereby a Cartesian coordinate system XYZ can be defined in which: Said target surface lies in the XY plane; Said groove extends parallel to the Y direction, with a width in the X direction; the method comprising: clamping the substrate on a movable substrate holder of the laser scribing apparatus such that the target surface is positioned to be targeted by a laser scribing head of the laser scribing apparatus; relatively moving said substrate holder and said scribing head, so as to cause laser radiation from the head to translate along a course of said scribeline, such that, when viewed in said XY plane, the laser scribing head produces a two-dimensional array of laser beam spots to form the groove.

2. A method according to claim 1, wherein said two-dimensional array of laser beam spots comprises plural beam spots extending substantially parallel to both the Y and the X directions.

3. A method according to claim 1, wherein, in at least a first part of the array, when viewed parallel to the X direction, laser beams at the extremities of said array have a lower intensity than laser beams in a central portion of the array.

4. A method according to claim 1, wherein, in at least a second part of the array, when viewed parallel to the Y direction, at least one laser beam at an extremity of said array has an intensity that is lower than the average intensity of the laser beams in said second part.

5. A method according to claim 1, wherein said array is produced by using at least one diffractive optical element to sub-divide a unitary laser beam.

6. A method according to claim 5, wherein said array is produced using a series arrangement of at least two diffractive optical elements, one of which produces beam sub-division in the X direction and the other of which produces beam sub-division in the Y-direction.

7. A method according to claim 1, wherein not all laser beams in the array have the same focal depth relative to the XY plane.

8. A method according to claim 1, wherein the intensity of at least a subset of beams in said array is adjustable.

9. A method according to claim 8, wherein, before impinging upon the substrate, the array is caused to traverse a spatial light modulator device having a programmable surface comprising a matrix of pixels, individual pixels being adjustable so as to variably attenuate individual beams in the array.

10. A method according to claim 9, wherein said programmable surface comprises a liquid crystal screen.

11. A method according to claim 1, wherein concurrent use is made of a plurality of said two-dimensional arrays of laser beam spots to simultaneously scribe a given substrate along a corresponding plurality of scribelines.

12. An apparatus for radiatively scribing a substantially planar semiconductor substrate using laser radiation, whereby a non-penetrative groove is formed along a scribeline that extends between opposing rows of semiconductor devices on a target surface of the substrate, which apparatus comprises: a laser scribing head, for producing said laser radiation; a movable substrate holder, configured and arranged to clamp the substrate thereto so as to present said target surface to the laser scribing head; an actuator, constructed and arranged to produce relative motion between said substrate holder and said scribing head, so as to cause laser radiation from the head to translate along a course of said scribeline, wherein the laser scribing head is constructed and arranged to produce a two-dimensional array of scribing laser beams to form the groove.

13. An apparatus as in claim 12, further comprising at least one diffractive optical element, constructed and arranged to sub-divide a unitary laser beam to form the two-dimensional array of scribing laser beams.

14. An apparatus as in claim 13, wherein the at least one diffractive optical element comprises a series arrangement of at least two diffractive optical elements, one of which is constructed and arranged to produce beam sub-division in the X-direction and the other of which is constructed and arranged to produce beam sub-division in the Y-direction.

15. An apparatus as in claim 12, wherein the laser scribing head is constructed and arranged to produce the two-dimensional array of scribing laser beams such that not all laser beams in the array have the same focal depth relative to the XY plane.

16. An apparatus as in claim 12, further comprising a spatial light modulator having a programmable surface comprising a matrix of pixels, individual pixels being adjustable so as to variably attenuate individual beams of the array of scribing laser beams.

17. An apparatus as in claim 16, wherein the programmable surface comprises a liquid crystal screen.

\* \* \* \* \*